United States Patent [19]
Amemiya et al.

[11] 3,825,858
[45] July 23, 1974

[54] LOCAL OSCILLATOR FOR USE IN A VHF TUNER FOR A TELEVISION RECEIVER

[75] Inventors: Kiyoshi Amemiya; Masakazu Kondou, both of Yokohama; Kazuhiko Yamazaki, Fujisawa; Fumio Kanai, Yokohama, all of Japan

[73] Assignee: Hitachi, Ltd., Tokyo, Japan

[22] Filed: Feb. 23, 1973

[21] Appl. No.: 335,139

[52] U.S. Cl............. 331/117 R, 331/177 V, 334/15
[51] Int. Cl........................... H03b 3/04, H03b 5/12
[58] Field of Search.......... 331/36 C, 117 R, 177 V; 334/15; 325/420, 459

[56] References Cited

UNITED STATES PATENTS 3,353,126 11/1967 Schucht ........................ 331/36 C X
3,526,859 9/1970 Pützer.................................. 334/15
3,564,423 2/1971 Pützer.............................. 334/15 X

*Primary Examiner*—Herman Karl Saalbach
*Assistant Examiner*—Siegfried H. Grimm
*Attorney, Agent, or Firm*—Craig and Antonelli

[57] ABSTRACT

A local oscillator for a VHF tuner employing variable capacitance diodes in which a high band tuning coil is tapped at a suitable point and an AFC circuit is connected to this point so as to eliminate variations of the AFC sensitivity depending on the high and low bands. Further, a variable capacitance diode is connected in series with the AFC circuit and tuning voltage is applied to this variable capacitance diode so as to eliminate variations of the AFC sensitivity depending on the channel.

2 Claims, 7 Drawing Figures

LOCAL OSCILLATOR FOR USE IN A VHF TUNER FOR A TELEVISION RECEIVER

BACKGROUND OF THE INVENTION

1. Field of the Invention

This invention relates to VHF tuners employing variable capacitance diodes and more particularly to a local oscillator for use in such tuner for providing an improvement in the AFC sensitivity (variations of the local oscillation frequency due to variations of the AFC voltage). The tuner according to the present invention is suitable for use in television receivers.

2. Description of the Prior Art

In the following description, the term "VHF tuner" is used to denote a so-called electronic tuning type VHF tuner employing variable capacitance diodes.

There are various requirements for a local oscillator for a VHF tuner used in television receivers. These requirements include (1) capability of stable oscillation, (2) freedom from any spurious oscillation, and (3) stability of the oscillation frequency against variations of such factors as power supply voltage, temperature and humidity. Capability of stable oscillation is an especially important requirement for such VHF tuner.

FIG. 1 shows the structure of a local oscillator used in a prior art VHF tuner. The circuit shown in FIG. 1 includes an oscillation transistor 1, a variable capacitance diode 2 for tuning, a variable capacitance diode 3 for automatic frequency control, a capacitor 4 for determining the reference value of the AFC sensitivity and preventing application of a.c. components of the AFC voltage $V_F$ to the tuning circuit, a bias resistor 5 for applying the AFC voltage $V_F$ to the variable capacitance diode 3, capacitors 6 and 6' for ensuring a satisfactory tracking between the oscillator and the high frequency amplifying circuit, a high band tuning coil 7 ($L_1$), a low band tuning coil 8 ($L_2$), a capacitor 9 for ensuring a satisfactory tracking during reception of the low band, a switching diode 10 for carrying out switch-over between the high and low bands, a bias resistor 11 for applying the switching voltage $V_S$ to the switching diode 10, and a bias resistor 12 for applying the tuning voltage $V_T$ to the variable capacitance diode 2 for tuning.

The portion surrounded by the dotted lines shows the AFC circuit.

In the circuit shown in FIG. 1, the switch-over of channels is carried out by varying the tuning voltage $V_T$ applied to the variable capacitance tuning diode 2 and the automatic frequency control is carried out by the AFC voltage $V_F$ applied to the variable capacitance AFC diode 3.

FIGS. 2a and 2b show equivalent circuits of the circuit shown in FIG. 1 during the reception of the high and low bands respectively. Suppose now that C and L are the composite capacitance and tuning inductance respectively in the equivalent circuits in FIGS. 2a and 2b, then the resonance frequency $f$ is given by $$f = 1/2\pi\sqrt{LC} \tag{1}$$

When now the capacitance of the variable capacitance AFC element is varied due to a variation $\Delta V_F$ of the AFC voltage $V_F$ and the composite tuning capacitance $C$ is varied by $\Delta C$, the variation $\Delta f$ of the tuning frequency $f$ is sought from the equation (1) as follows:

$$\Delta f = -\tfrac{1}{2}(\Delta C/C)f \tag{2}$$

It will be readily seen from the equation (2) that the frequency variation $\Delta f$ during the reception of the high band is about three times the frequency variation $\Delta f$ during the reception of the low band due to the difference in the local oscillation frequency even when tuning is attained with the same capacitance value in both the high band and the low band, although the values of the tuning inductance L are different from each other. Further, due to the diode tuning method, the composite tuning capacitance C varies within a wide range in the lower channels of each band in spite of the same variation of the capacitance value of the variable capacitance AFC element.

This results in $\Delta f$ variations by a factor of four to five throughout the receivable channels.

It will thus be seen that the prior art circuit arrangement shown in FIG. 1 has been defective in that not only the required stable oscillation cannot be expected but also the automatic frequency control cannot be sufficiently attained due to great variations of the AFC sensitivity, resulting frequently in disappearance of the televised picture depending on variations in the receiving conditions. The prior art circuit arrangement has further been defective in that signals other than that of the receiving channel appear in the channels for which the automatic frequency control can be sufficiently attained.

FIG. 4 shows the results of actual measurement of the AFC sensitivity in the channels of the low and high bands. The dotted line 13 represents the AFC sensitivity when a voltage higher than the voltage corresponding to the reference value of the AFC sensitivity is applied. The dotted line 14 represents the AFC sensitivity when the voltage corresponding to the reference value of the AFC sensitivity is applied. It will be seen that, in both these cases, the AFC sensitivities for the channels NOS. 1 and 12 differ by about a factor of five.

SUMMARY OF THE INVENTION

The present invention which provides improvements in the prior art structure is featured by dividing a high band tuning coil into two coil portions, connecting an AFC circuit to the connection point of the divided coil portions, and connecting a variable capacitance diode in series with the AFC circuit for minimizing undesirable variations of the AFC sensitivity depending on the high and low bands and minimizing undesirable variations of the AFC sensitivity depending on the channel.

It is an object of the present invention to provide a local oscillator of simple structure for use in a VHF tuner for minimizing undesirable variations for the AFC sensitivity depending on the high and low bands.

Another object of the present invention is to provide a local oscillator of simple structure for use in a VHF tuner for minimizing undesirable variations of the AFC sensitivity depending on the channel.

DESCRIPTION OF THE PREFERRED EMBODIMENT

Figure 3:
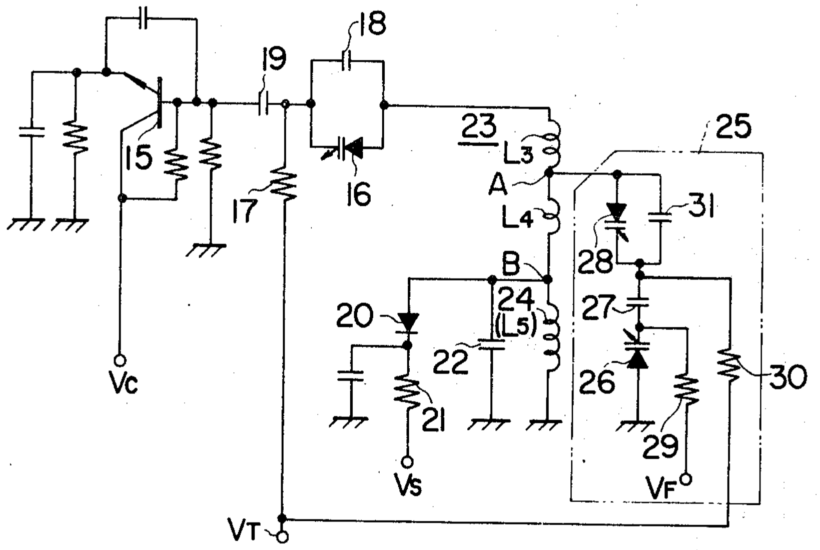
FIG. 3 is a circuit diagram showing the structure of a local oscillator embodying the present invention.

FIG. 3 is a circuit diagram showing the structure of a local oscillator embodying the present invention. Referring to FIG. 3, the circuit includes an oscillation transistor 15, a variable capacitance tuning diode 16 constituting a resonance circuit, a bias resistor 17 for applying the tuning voltage $V_T$ to the variable capacitance diode 16, capacitors 18 and 19 for ensuring a satisfactory tracking between the oscillator and the high frequency amplifying circuit, a switching diode 20 for carrying out switch-over between the high and low bands, a bias resistor 21 for this switching diode 20, and a capacitor 22 for ensuring a satisfactory tracking during the reception of the low band. These elements are similar to those shown in FIG. 1.

Figure 1:
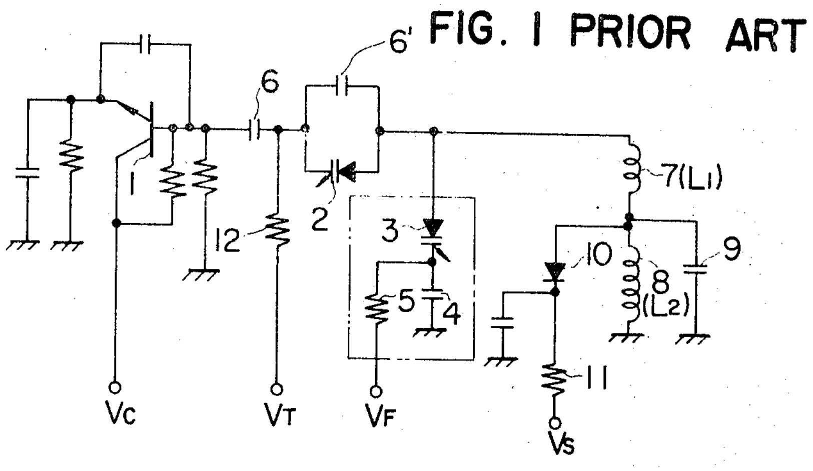
FIG. 1 PRIOR ART
FIG. 1 shows the structure of a local oscillation used in a prior art VHF tuner.
Figure 2A:
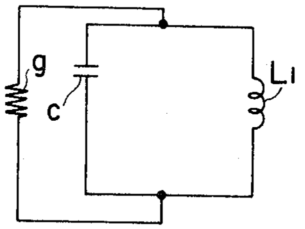
FIG. 2a PRIOR ART
FIGS. 2*a* and 2*b* show equivalent circuits of the circuit shown in FIG. 1 during the reception of the high and low bands respectively.
Figure 2B:
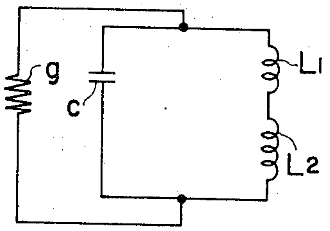
FIG. 2b PRIOR ART

The circuit of the present invention shown in FIG. 3 differs from the circuit shown in FIG. 1 in that a high band tuning coil 23 connected to a low band tuning coil 24 ($L_5$) is divided into two coil portions $L_3$ and $L_4$, and an AFC circuit represented by a dotted block 25 is connected to the connection point of the divided coil portions $L_3$ and $L_4$.

The high band tuning coil 23 is divided into the coil portions $L_3$ and $L_4$ in such a manner that the number of turns of the coil portion $L_3$ is greater than that of the coil portion $L_4$. The AFC circuit, which is represented by the dotted block 25 and is connected to the connection point A of the coil portions $L_3$ and $L_4$ of the high band tuning coil 23, comprises a variable capacitance AFC diode 26, a capacitor 27 for determining the reference value of the AFC sensitivity and preventing application of a.c. components of the AFC voltage $V_F$ to the tuning circuit, and another variable capacitance diode 28 connected in series with the capacitor 27 and the connection point A of the coil portions $L_3$ and $L_4$ of the high band tuning coil 23. The AFC voltage $V_F$ is applied to the variable capacitance AFC diode 26 through a bias resistor 29, and the tuning voltage $V_T$ is applied to another variable capacitance diode 28 through a bias resistor 30. The variable capacitance diode 28 is provided for minimizing undesirable variations of the AFC sensitivity depending on the channel in the individual bands. A capacitor 31 is further provided for improving the effect of correction.

Undesirable variations of the AFC sensitivity depending on the high and low bands can be minimized by the circuit of the present invention in a manner as described below.

During the reception of the high band, the connection point B of the low band tuning coil 24 ($L_5$) and the coil portion $L_4$ of the high band tuning coil 23 is grounded through the switching diode 20, and therefore, the coil portion $L_4$ of the high band tuning coil 23 is connected in parallel with the variable capacitance AFC diode 26. The equation (2) described previously holds similarly if the high band tuning coil 23 were not divided into the coil portions $L_3$ and $L_4$. However, due to the fact that the high band tuning coil 23 is divided into the coil portions $L_3$ and $L_4$ and a variation $\Delta V_F$ of the FAC voltage $V_F$ results in a variation $\Delta C$ of the composite capacitance C, the variation $\Delta f$ of the tuning frequency f can now be expressed as $$\Delta f = -\tfrac{1}{2} K (\Delta C/C) f \tag{3}$$

where $K$ is the correction factor by the coil portions $L_3$ and $L_4$. This correction factor $K$ is given by $$K = (L_4/L_3 + L_4)^2 \tag{4}$$

and since the relation $L_3 > L_4$ holds between the divided coil portions $L_3$ and $L_4$, the value of $K$ is $$K < 1 \tag{5}$$

Thus, the variation $\Delta f$ of the tuning frequency $f$ is varied by varying the value of the correction factor $K$, hence the division ratio between the coil portions $L_3$ and $L_4$.

On the other hand, during the reception of the low band, the switching diode 20 is inactive. In this case, the low band tuning coil 24 ($L_5$) is predominant in determining the oscillation frequency and the high band tuning coil 23 can be ignored. Thus, the value of the correction factor K in the equation (3) during the reception of the low band is $$K = 1 \tag{6}$$

It will be understood from the above description that undesirable variations of the AFC sensitivity depending on the high and low bands can be minimized by varying the division ratio between the coil portions $L_3$ and $L_4$ of the high band tuning coil 23 in such a manner that the frequency variation $\Delta f$ in the case of the reception of the high band approaches the frequency variation $\Delta f$ in the case of the reception of the low band.

Undesirable variations of the AFC sensitivity in relation to variations of the capacitance of the variable capacitance tuning diode 16 can be minimized in a manner as described below.

Figure 5:
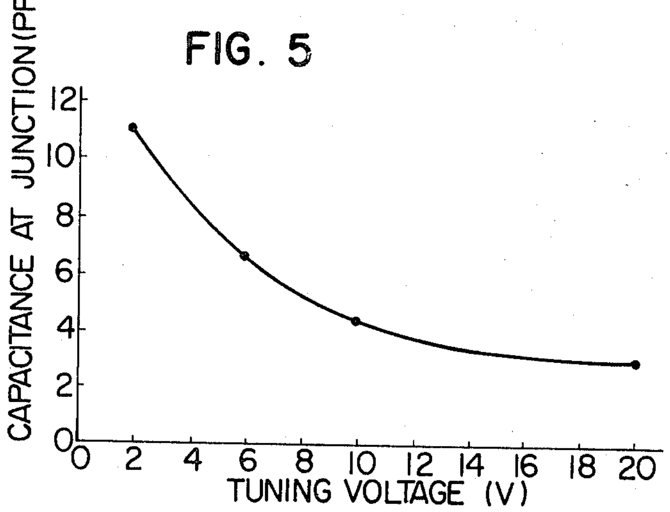
FIG. 5 is a graph showing the relation between the junction capacitance of a variable capacitance diode in FIG. 3 and the tuning voltage.
Figure 6:
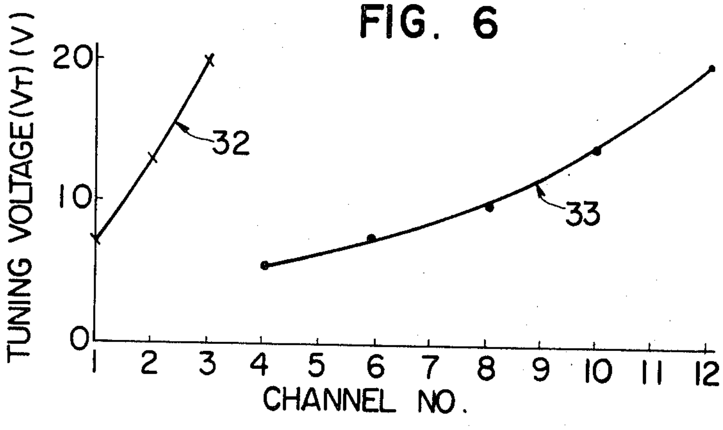
FIG. 6 is a graph showing the relation between the tuning voltage and the channels.

FIG. 5 shows variations of the junction capacitance of the variable capacitance diode 28 relative to the tuning voltage $V_T$. FIG. 6 shows the relation between the tuning voltage $V_T$ and the channels. In FIG. 6, the curve 32 represents the tuning voltage $V_T$ during the reception of the low band, and the curve 33 represents the tuning voltage $V_T$ during the reception of the high band.

The variable capacitance diode 28 connected in series with the variable capacitance AFC diode 26 has an operating characteristic as shown in FIG. 5 and the tuning voltage $V_T$ is applied thereto. It will therefore be seen from FIGS. 5 and 6, the tuning voltage $V_T$ applied to the variable capacitance diode 28 is lowered and the junction capacitance is increased as the channel is switched over from the channel No. 12 toward the channel No. 1. Thus, the tuning capacitance of the variable capacitance tuning diode 16 for the lower channels in the high or low band is increased to increase the composite tuning capacitance C. The capacitance of the variable capacitance diode 28 is also increased to increase the value of $\Delta C$ correspondingly for preventing variations of the value of $\Delta c/C$. It is therefore possible to minimize undesirable variations of the AFC sensitivity depending on the channel in the individual bands.

Figure 4:
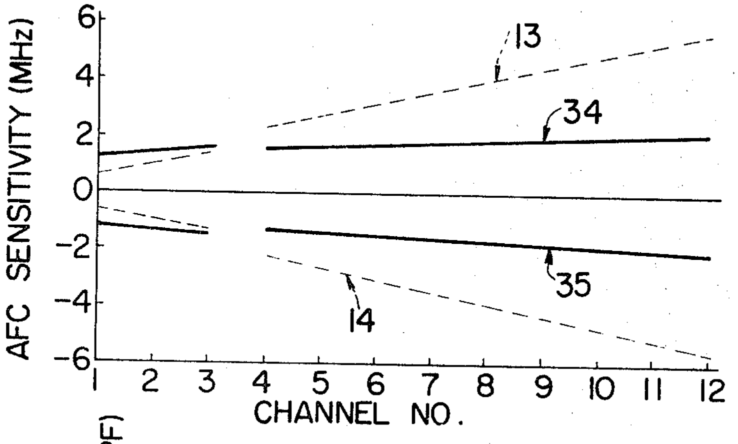
FIG. 4 is a graph showing the results of actual measurement of the AFC sensitivity in the channels of the high and low bands.

The solid lines 34 and 35 in FIG. 4 represent the AFC sensitivity characteristics of the local oscillator according to the present invention and it will be seen that the AFC sensitivity is substantially flat and undesirable variations of the AFC sensitivity depending on the channel csn be substantially eliminated.

It will be understood from the foregoing description that the present invention can minimize undesirable variations of the AFC sensitivity throughout the receivable channels and provides a remarkable advantage in that television receivers incorporating the improved local oscillator can receive all the channels with high stability.

It should be undestood that the effect similar to that above described can be obtained when any other suitable variable capacitance elements than the variable capacitance diodes may be employed in the embodiment of the present invention.

We claim:

1. A local oscillator for use in a VHF tuner for a television receiver, said oscillator comprising an oscillation circuit including a transistor for generating oscillation, a parallel connection of a first variable capacitance diode and a capacitor, one junction point of said parallel connection being connected to the base of said transistor, and a series connection of a high band tuning coil and a low band tuning coil connected between the other junction point of said parallel connection and ground potential, said high band tuning coil being divided into two coil sections to thereby generate a signal having a frequency determined substantially by the capacitance of said first variable capacitance diode and the inductance of said tuning coils, means connected to said first variable capacitance diode for applying a first control voltage to said diode to thereby change the oscillation frequency of said oscillation circuit, a switching diode for band selection connected to the junction point between said high band tuning coil and said low band tuning coil, means connected to said switching diode for applying a second control voltage to said switching diode, an automatic frequency control circuit connected to the junction point between said two sections of said high band tuning coil, said automatic frequency control circuit including a second variable capacitance diode connected between the junction point of said coil sections and ground potential, and means connected to said second variable capacitance diode for applying a third control voltage to said second variable capacitance diode to thereby adjust the control sensitivity of said automatic frequency control circuit according to the third control voltage.

2. A local oscillator according to claim 1, wherein said automatic frequency control circuit further includes a parallel connection of a third variable capacitance diode and a capacitor, said parallel connection being connected in series with said second variable capacitance diode, and means connected to said third variable capacitance diode for applying the first control voltage to said third variable capacitance diode to thereby adjust the control sensitivity of said automatic frequency control circuit according to the first control voltage.

* * * * *